(12) United States Patent
Aton et al.

(10) Patent No.: US 7,735,056 B2
(45) Date of Patent: Jun. 8, 2010

(54) AUTOMATED CIRCUIT DESIGN DIMENSION CHANGE RESPONSIVE TO LOW CONTRAST CONDITION DETERMINATION IN PHOTOMASK PHASE PATTERN

(75) Inventors: Thomas J. Aton, Dallas, TX (US); Carl Albert Vickery, III, Garland, TX (US); Shane R. Palmer, Austin, TX (US)

(73) Assignee: Texas Instruments Incorporated, Dallas, TX (US)

( * ) Notice: Subject to any disclaimer, the term of this patent is extended or adjusted under 35 U.S.C. 154(b) by 783 days.

(21) Appl. No.: 11/392,869

(22) Filed: Mar. 30, 2006

(65) Prior Publication Data

US 2007/0231711 A1 Oct. 4, 2007

(51) Int. Cl.
G06F 17/50 (2006.01)
G03F 1/00 (2006.01)
(52) U.S. Cl. .............................. 716/21; 716/19; 716/20; 430/5
(58) Field of Classification Search .................... 716/19, 716/21; 430/5
See application file for complete search history.

(56) References Cited

U.S. PATENT DOCUMENTS

| | | | |
|---|---|---|---|
| 6,764,795 B2 | 7/2004 | Aton et al. | |
| 7,165,234 B2* | 1/2007 | Pierrat | 716/21 |
| 7,264,905 B2* | 9/2007 | Nagamura et al. | 430/5 |
| 7,386,830 B2* | 6/2008 | Fukuhara | 716/19 |
| 2005/0136341 A1* | 6/2005 | Park et al. | 430/5 |
| 2006/0024850 A1* | 2/2006 | Monahan et al. | 438/14 |
| 2006/0046168 A1* | 3/2006 | Fukuhara | 430/30 |
| 2006/0273242 A1* | 12/2006 | Hunsche et al. | 250/208.1 |
| 2007/0061773 A1* | 3/2007 | Ye et al. | 716/21 |
| 2007/0065730 A1* | 3/2007 | Misaka | 430/5 |
| 2008/0208910 A1* | 8/2008 | MacIntyre et al. | 707/104.1 |

OTHER PUBLICATIONS

Ashton, Robert A., Test Structures for Evaluating Strong Phase Shift Lithography, IEEE Transactions on Semiconductor Manufacturing, vol. 15, No. 2, May 2002, pp. 195-200.

* cited by examiner

*Primary Examiner*—Helen Rossoshek
(74) *Attorney, Agent, or Firm*—Warren L. Franz; Wade J. Brady, III; Frederick J. Telecky, Jr.

(57) ABSTRACT

The present application is directed to methods of forming a phase pattern for an integrated circuit feature described in a design database as having a first target dimension. In one embodiment, the method comprises determining whether forming a phase pattern for the integrated circuit feature described in the design database will result in one or more phase blocks of the same phase type being positioned in relative proximity so as to result in a low contrast condition, selecting a second target dimension that will avoid the low contrast condition if the low contrast condition will result, and forming the phase pattern for an integrated circuit feature having the second target dimension. Systems for forming phase patterns and photomasks comprising the phase patterns of the present application are also disclosed.

27 Claims, 4 Drawing Sheets

AUTOMATED CIRCUIT DESIGN DIMENSION CHANGE RESPONSIVE TO LOW CONTRAST CONDITION DETERMINATION IN PHOTOMASK PHASE PATTERN

DESCRIPTION OF THE DISCLOSURE

1. Field of the Disclosure

The present application relates generally to the field of photolithography, and more specifically to a method and system for preparing a phase pattern for an alternating phase shift mask.

2. Background of the Disclosure

Conventional optical projection lithography has been the standard silicon patterning technology for the past 20 years. It is an economical process due to its inherently high throughput, thereby providing a desirable low cost per part or die produced. A considerable infrastructure (including steppers, photomasks, resists, metrology, etc.) has been built up around this technology.

In this process, a mask, or "reticle", includes a semiconductor circuit layout pattern typically formed of opaque chrome, on a transparent glass (typically $SiO_2$) substrate. A stepper includes a light source and optics that project light coming through the mask and images the circuit pattern, typically with a 4× to 5× reduction factor, on a photo-resist film formed on a silicon wafer. The term "chrome" refers to an opaque masking material that is typically but not always comprised of chrome. The transmission of the opaque material may also vary such as in the case of an attenuating phase shift mask.

As the critical dimensions of integrated circuits continue to decrease, there is a need to pattern smaller and smaller features. Modern photolithographic systems often employ light in the imaging process which has a larger wavelength than the critical dimensions of the device features being formed on the integrated circuits. When critical dimensions are printed at less than or equal to the wavelength of light being used, the wave properties of the light become a dominant property of the lithography. In general, these wave properties are seen as being a limiting factor in lithography. There are, however, techniques in which the wave properties of light can be used to improve patterning of features smaller than the wavelength of light.

One such technique, known as strong phase shift lithography, employs phase shift masks (PSM) to take advantage of the constructive and destructive properties of light to improve feature definition. Strong phase shift lithography is often used to pattern transistor gates, in for example, CMOS technologies, where a small, well-controlled gate length can yield considerable performance advantage.

One of the most common commercial implementations of phase shift mask technology is the double exposure method. In this method, the critical features are imaged using a phase shift mask, and the non-critical and trim features are imaged in a second exposure using a conventional chrome-on-glass mask, such as a trim mask.

However, it has been found that increasing density of circuit devices can result in instances where non-critical and/or trim features may be imaged by the phase shift mask. This can result in imaging problems when attempting to pattern certain device features.

SUMMARY OF THE DISCLOSURE

In accordance with the disclosure, one embodiment of the present application is directed to a method of forming a photomask comprising a phase pattern for an integrated circuit feature described in a design database as having a first target dimension. The method comprises determining whether forming a phase pattern for the integrated circuit feature described in the design database will result in one or more phase blocks of the same phase type being positioned in relative proximity to each other so as to result in a low contrast condition, selecting a second target dimension that will avoid the low contrast condition if the low contrast condition will result, and forming a phase pattern for an integrated circuit feature having the second target dimension.

Another embodiment of the present application is directed to a system for generating a phase pattern for a phase mask. The system comprises a database operable to store data describing at least one integrated circuit feature having a first target dimension, and a module coupled to the database. The module comprises a set of instructions operable to determine whether forming a phase pattern for the integrated circuit feature described in the database will result in one or more phase blocks of the same phase type being positioned in relative proximity to each other so as to result in a low contrast condition. If the low contrast condition will result, the module can generate some output to alter the phase pattern in response to the low contrast condition.

Another embodiment of the present application is directed to method of forming an integrated circuit employing a photomask made by the processes of the present application. In embodiments, an integrated circuit can be formed by applying a photoresist to a wafer and then exposing the photoresist to radiation through a photomask made by a method of the present application. The exposed photoresist is then developed by methods well known in the art, and the wafer is etched to form the integrated circuit device.

Yet another embodiment of the present application is directed to an integrated circuit formed using a photomask of the present application. In embodiments, an integrated circuit can be patterned by applying a photoresist to a wafer and then exposing the photoresist to radiation through a photomask made by a method of the present application. The exposed photoresist is then developed by methods well known in the art, and the wafer is etched to form the integrated circuit device.

Additional objects and advantages of the disclosure will be set forth in part in the description which follows, and can be learned by practice of the disclosure. The objects and advantages of the disclosure will be realized and attained by means of the elements and combinations particularly pointed out in the appended claims.

It is to be understood that both the foregoing general description and the following detailed description are exemplary and explanatory only and are not restrictive of the disclosure, as claimed.

The accompanying drawings, which are incorporated in and constitute a part of this specification, illustrate several embodiments of the disclosure and, together with the description, serve to explain the principles of the disclosure.

DESCRIPTION OF THE EMBODIMENTS

Reference will now be made in detail to various exemplary embodiments of the present application, examples of which are illustrated in the accompanying drawings. Wherever possible, the same reference numbers will be used throughout the drawings to refer to the same or like parts.

Figure 1:
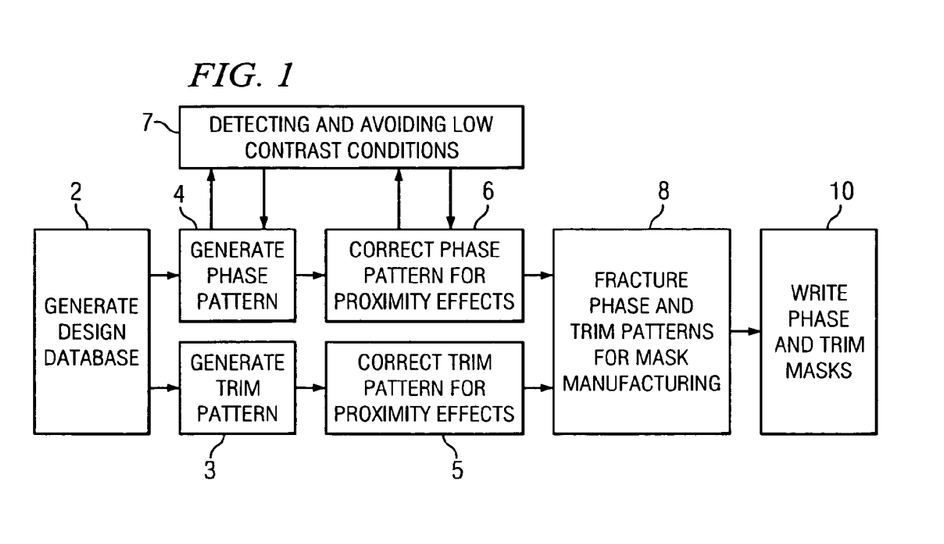
FIG. 1 illustrates a flow diagram of a method for making a set of photomasks, according to an embodiment of the present application.

FIG. 1 illustrates a flow diagram of one embodiment of a method for making a set of photomasks, including a phase shift mask and a trim mask, used for pattering an integrated circuit device. The embodiments of the present application are not intended to be limited to the processes illustrated in FIG. 1, and other additional processes not shown in the flow diagram of FIG. 1 may also be employed. For example, the addition of sub-resolution assist features is a well known process which may be included in the method of FIG. 1, if desired.

As shown in block 2, a design database is generated which contains data describing at least a portion of the integrated circuit design. From the design data, trim patterns and phase patterns may be generated to begin the formation of the trim mask and phase shift masks, respectively, as indicated in blocks 3 and 4. Methods for forming phase and trim patterns from design data are well known in the art, and any suitable method may be employed. In an embodiment, the phase and trim patterns are drawn using software programs designed to read data from the design database and prepare appropriate patterns for forming the masks used to make the integrated circuit designs described in the database. One example of a suitable software program is IN-PHASE, which is available from SYNOPSYS, Inc.

The shape of the trim patterns and phase patterns generated in blocks 3 and 4 will generally reflect the target pattern, which is the desired shape of the pattern to be formed on the wafer. However, the shape of the final patterns formed on the photomasks may sometimes differ from the target pattern to take into account, for example, optical diffraction effects that occur during the imaging process. To account for optical effects on patterning, trim and phase patterns may be adjusted using optical proximity correction (OPC) techniques, as indicated in blocks 5 and 6 of the embodiment of FIG. 1. Any suitable technique for correcting for optical proximity effects may be employed. Examples of suitable optical phase correction techniques are disclosed in U.S. Pat. No. 6,764,795, issued on Jul. 20, 2004 to Aton et al., the disclosure of which techniques is herein incorporated by reference in its entirety.

As illustrated in block 7 of FIG. 1, the processes of generating and correcting the phase pattern in blocks 4 and 6 may comprise processes for detecting and/or correcting low contrast conditions. A low contrast condition is a condition for which it is determined that low contrast imaging may result during imaging of the photoresist. Low contrast imaging results when the light intensity contrast between light and dark regions of an imaged pattern is insufficient for proper imaging of the photoresist. For example, the light intensity may be above a certain threshold value for certain regions of the photoresist where exposure to light is not desirable. This may result in overexposure of these regions, and improper patterning of the photoresist.

After correction of the phase and trim pattern for optical proximity effects, the mask pattern data is prepared for manufacturing, or writing, the mask. For example, as shown in block 8, the mask pattern data may be fractured, which puts the data in a form which is compatible with the mask writing process. The data fracture process may be accomplished using any suitable software program. One example of a suitable software program known in the art for mask data fracturing is CATS, which is available from SYNOPSYS.

The mask data is then used to write the photo masks, as shown in block 10 of FIG. 1. Any suitable technique for writing the photomask may be used. Suitable techniques for writing masks are well known in the art.

Figure 2:
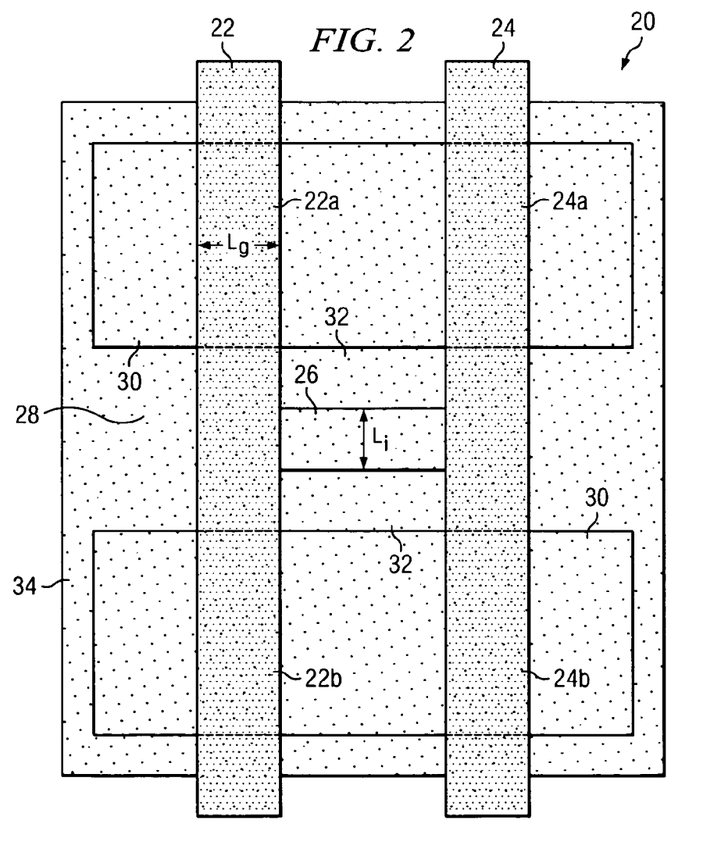
FIG. 2 illustrates a trim pattern for forming an integrated circuit device, according to an embodiment of the present application.
Figure 3:
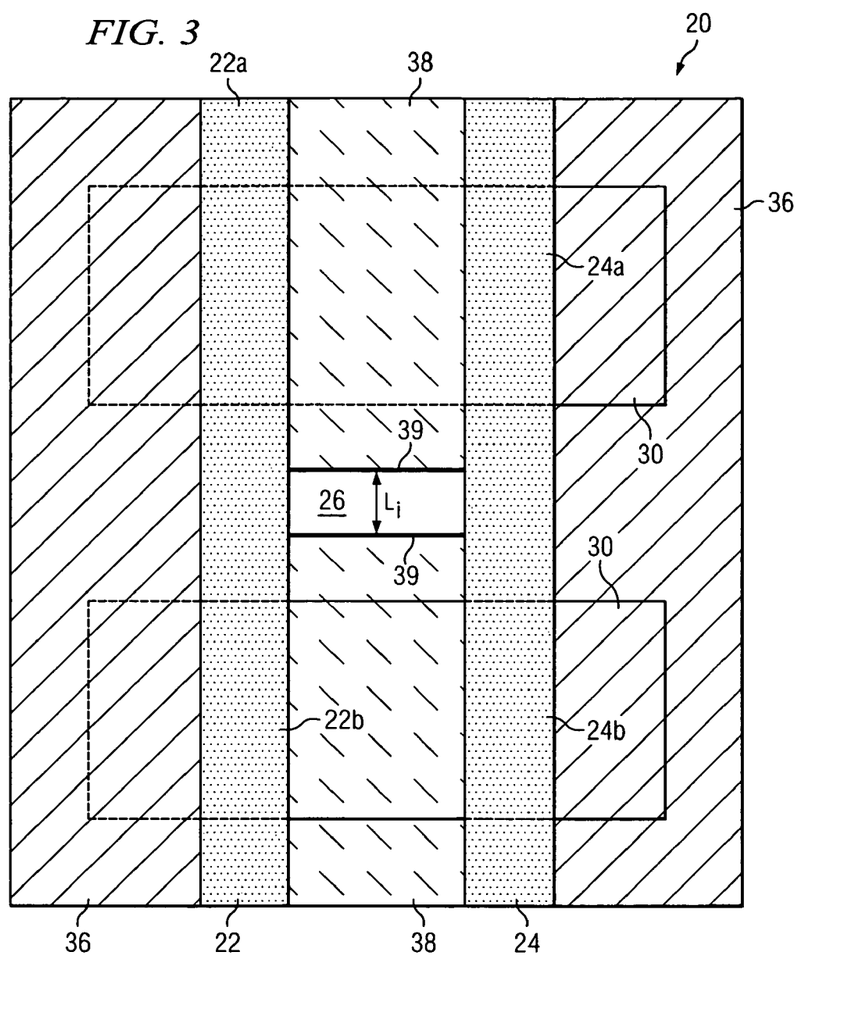
FIG. 3 illustrates a phase pattern for forming an integrated circuit device, according to an embodiment of the present application.

FIGS. 2 and 3 illustrate an example of integrated circuit device 20 for which a low contrast condition may occur. FIG. 2 further illustrates a trim pattern, and FIG. 3 illustrates a phase pattern, for the integrated circuit device, as will be discussed in greater detail below.

Integrated circuit device 20, as illustrated in FIGS. 2 and 3, comprises two parallel conductors 22 and 24, each having two gate regions, 22a, 22b, 24a and 24b, respectively. Parallel conductors 22 and 24 are electrically connected using an interconnect 26 formed over field region 28 between active regions 30.

In an embodiment, gate regions 22a, 22b, 24a, and 24b, having gate lengths, $L_g$, are imaged using a phase mask. Interconnect 26, which has a length, $L_i$, that is not considered to be a critical dimension, is also imaged with the phase mask, because regions 32, positioned between active regions and interconnect 26, are too small to be successfully patterned with a trim mask, due to the close proximity of active regions 30.

In regions where integrated circuit patterns are formed with a phase mask, such as gate regions, 22a, 22b, 24a, and 24b, the trim mask may comprise a trim wing, which is a pattern on the trim mask that protects these regions from being imaged during the trim mask exposure. As shown in the FIG. 2 embodiment, because both the gate regions 22a, 22b, 24a, and 24b, and the interconnect 26 will be patterned with the phase mask, a trim wing 34 is formed over substantially the entire device region, including over field region 28 on which interconnect 26 is formed, and gate regions 22a, 22b, 24a, and 24b.

FIG. 3 illustrates one embodiment of a phase pattern for a phase mask used for imaging conductors 22 and 24, and interconnect 26, of integrated circuit device 20. The phase pattern comprises one or more phase blocks of a first phase type and one or more phase blocks of a second phase type. The first and second phase types may be chosen so that the phase blocks of the first and second phase types are positioned in an alternating pattern in a manner that allows the constructive and destructive properties of the light used in the imaging process to improve pattern definition. In some embodiments, the first phase type and the second phase type are chosen to be about 180° out of phase relative to each other. For example, in the embodiment of FIG. 2, phase blocks 36 are 0° phase blocks and phase blocks 38 are 180° phase blocks, resulting in a 180° phase shift between the two phase block regions 36 and 38.

In certain situations, however, it may not be desirable, or even possible, to employ alternating first and second phase block types. For example, in the embodiment of FIG. 3, the outer phase blocks 36 may be required by mask making rules to be single phase blocks of the same type formed along the entire outer length of conductors 22 and 24, due to the close proximity of the active regions 30. Because gate regions 22a, 22b, 24a and 24b must be patterned using an alternating phase block configuration to provide the desired patterning accuracy for the critical gate length dimensions, the center phase blocks 38 are now forced to be the same phase type. This results in a situation where two phase blocks 38, which are of the same phase type, are used to pattern interconnect 26.

Figure 4:
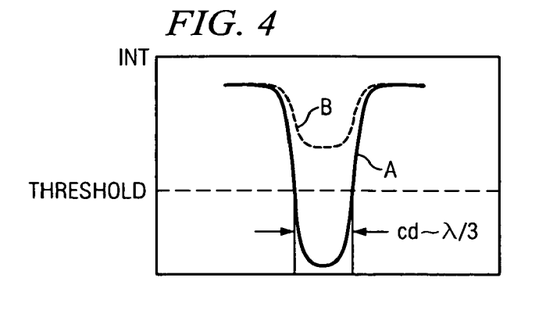
FIG. 4 is a light intensity graph showing a low contrast imaging condition.

The phase block pattern of FIG. 3 may lead to a low contrast imaging condition where the design database describes interconnect 26 as having a target dimension of length, $L_i$, which is too small to pattern without the use of alternating phase blocks. The potential effect of such a low contrast imaging condition is represented in a light intensity graph shown in FIG. 4. In the graph of FIG. 4, a device feature having an exemplary critical dimension (CD) of about $\lambda/3$ is imaged, where $\lambda$ is the wavelength of light used for imaging. The curve A represents the light intensity profile across the critical dimension of the feature when using alternating first and second block types, while curve B represents the light intensity profile when the same type phase blocks are used for imaging the feature. As shown by curve B, when the same type phase blocks are used, the light intensity does not fall below a threshold light intensity that is necessary for proper patterning of the photoresist, thus resulting in a low contrast imaging condition.

Thus, in the embodiment of FIG. 3, forming a phase pattern for the integrated circuit described in the design database may result in a low contrast condition where two phase blocks of the same phase type are positioned in close proximity to each other so as to pattern an integrated circuit feature having a target dimension, $L_i$. In this situation, the low contrast situation will result where $L_i$ is too small to be effectively patterned using two phase blocks of the same phase type. The size of $L_i$ that is too small to be effectively patterned may vary, depending on such things as the illumination conditions in the stepper that illuminate the mask and the lens characteristics of the stepper. For example, a low contrast imaging condition may be determined to exist where $L_i$ is about $\lambda$ or smaller, such as where $L_i$ ranges from about $2\lambda/3$ to about $\lambda/3$. In such situations, it may be possible to alter the target dimensions of the device features in the phase patterns, relative to the target dimensions described, for example, in the design database, to avoid the low contrast condition.

Figure 5:
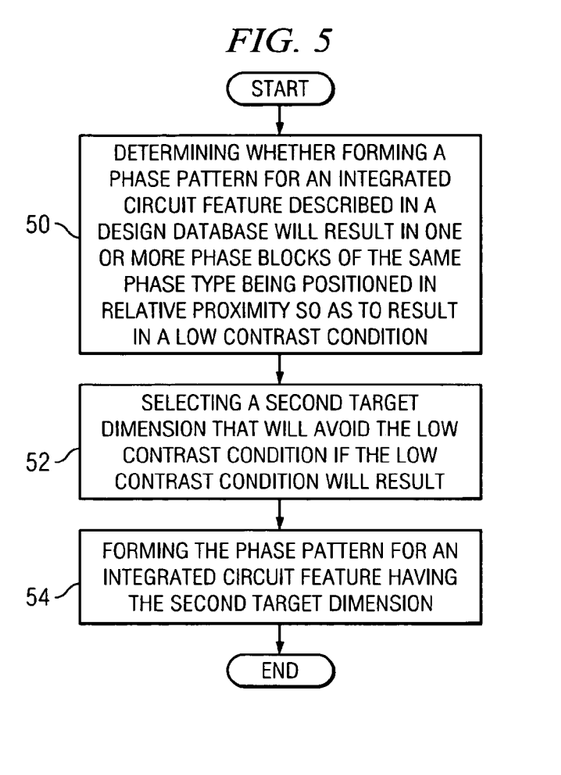
FIG. 5 illustrates a flow chart for a method of detecting and avoiding a low contrast condition, according to an embodiment of the present application.

FIG. 5 illustrates a flow chart for a method of detecting and avoiding a low contrast condition, according to an embodiment of the present application. The method of the FIG. 5 embodiment may be carried out in any suitable manner. For example, the method of the FIG. 5 embodiment may be carried by providing a set of instructions to a computer in the form of a low contrast condition module, the set of instructions being capable of determining whether a low contrast condition may result and providing some output for avoiding the low contrast condition. Providing suitable computer readable instructions for carrying out the method of FIG. 5 is within the ordinary skill of the art.

The processes of detecting and avoiding a low contrast condition will now be described in greater detail with reference to FIG. 5. The process of detecting a low contrast condition comprises determining whether a target integrated circuit design may result in a low contrast condition, such as the condition described with reference to FIG. 3 above. As shown in block 50 of the FIG. 5 embodiment, this detection process comprises determining whether forming a phase pattern for the integrated circuit feature described in the design database will result in one or more phase blocks of the same phase type being positioned in relative proximity to each other so as to result in a low contrast condition, as described above.

In the detection process described in block 50, the one or more phase blocks may be any phase block type, as long as the one or more phase blocks represent approximately the same degree of phase shift. For example, where two phase blocks of the same phase type are positioned in relative proximity, the two phase blocks may both be 0° phase blocks types. In another embodiment, the two phase blocks may both be 180° phase blocks types.

Figure 6:
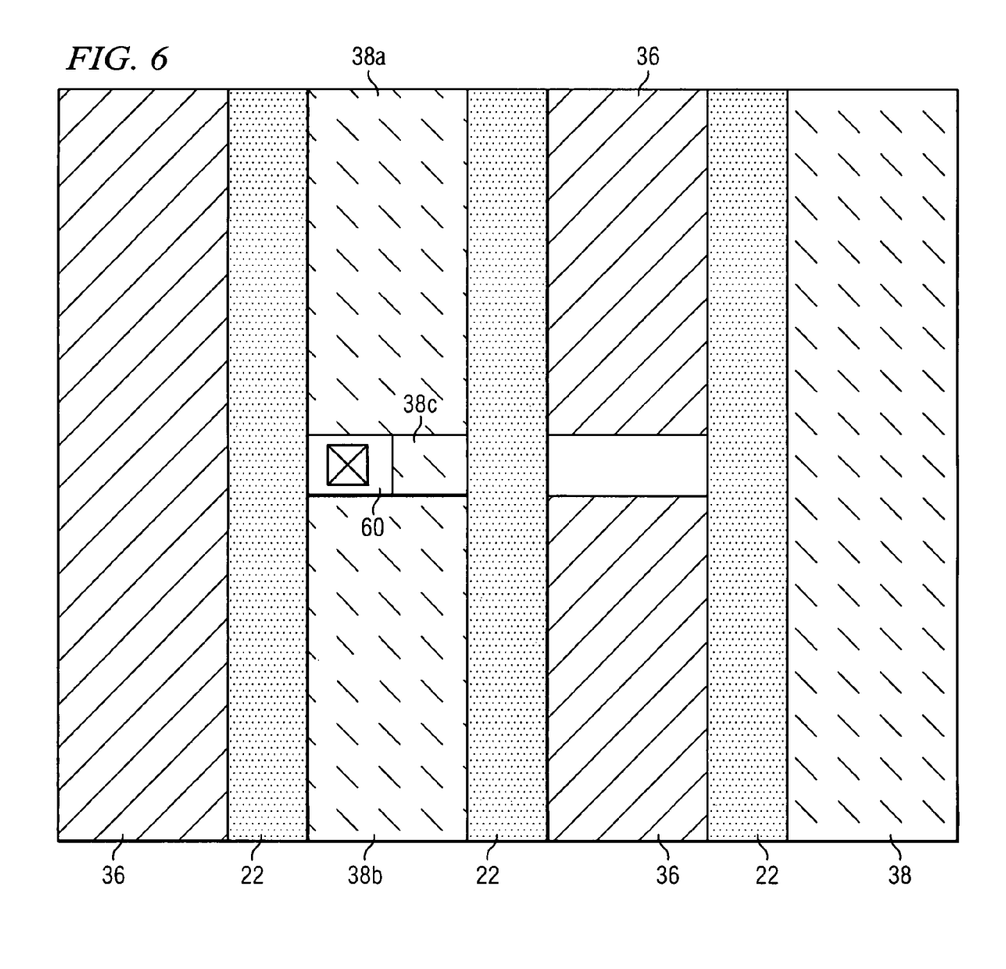
FIG. 6 illustrates a phase pattern for forming an integrated circuit device that may be adjusted to avoid a low contrast condition, according to an embodiment of the present application.

The one or more phase blocks of the same type may be positioned for patterning an integrated circuit feature having any non-critical target dimension, such as in the embodiment of FIG. 3, where two phase blocks 38 are positioned to pattern interconnect 26 having non-critical dimension, $L_i$. In other embodiments, one or more phase blocks of the same phase type may be positioned in relative proximity to each other to pattern any device feature having a non-critical target dimension, such as the contact 60 illustrated in FIG. 6. As illustrated in FIG. 6, a single phase block 38 of the same phase type wraps around three sides of contact 60. For illustrative purposes, phase block 38 is shown as having regions 38a, 38b and 38c. Because regions 38a and 38b of phase block 38 are positioned in relative proximity to each other to determine a target width dimension of contact 60, a low contrast condition may result.

In some embodiments, the determining process described in block 50 is carried out during generation of the phase pattern described in block 4 of FIG. 1. In these embodiments, the integrated circuit design data of block 2 may be analyzed to determine whether a low contrast condition is described. For example, the data may be analyzed to determine if a device feature having a non-critical dimension, such as interconnect 26, must be patterned using two phase blocks of the same phase type, such as phase blocks 38, as illustrated in FIG. 3. If the two phase blocks are within a pre-selected distance of each other, which has been determined to be too small to be patterned using two phase blocks of the same phase type, the low contrast condition exists. The preselected distance may be any suitable distance, such as, for example, a distance chosen to be within the ranges described above for $L_i$.

In other embodiments, the determining process described in block 50 may be carried out during the process of correcting the phase pattern for optical proximity effects, described in block 6 of FIG. 1. During the optical proximity correction process, the phase pattern may be adjusted to account for such things as optical diffraction. In some embodiments, correcting the phase pattern may comprise dividing the phase blocks of the phase pattern into a plurality of segments in order to determine optical proximity effects for each segment, as described, for example, in U.S. Pat. No. 6,764,795, issued on Jul. 20, 2004 to Aton et al. The disclosure of the '795 patent that is related to correcting phase patterns in this manner is herein incorporated by reference in its entirety, as described above.

Figure 7:
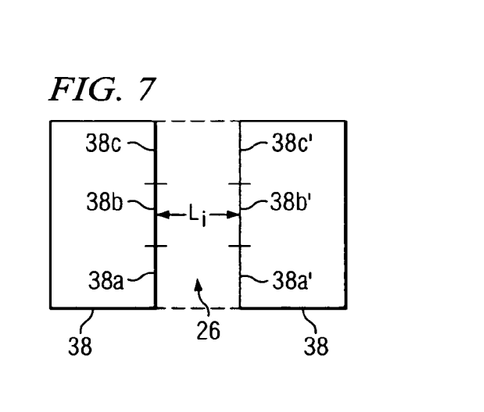
FIG. 7 illustrates a phase pattern comprising phase blocks divided into segments that may be adjusted to avoid a low contrast condition, according to an embodiment of the present application.

FIG. 7 illustrates one such embodiment where phase blocks 38 are divided into segments 38a, 38b, 38c, 38a', 38b' and 38c'. The segments may be positioned on opposing sides of interconnect 26 to approximate a target dimension, $L_i$, of interconnect 26. During the proximity correction of block 6, a critical dimension correction may be performed for phase blocks 38 by individually adjusting the segments to provide proper critical dimension correction.

If the phase blocks are divided into segments as described above, the process of determining whether a low contrast condition will result may comprise determining whether each segment satisfies the low contrast condition in which a segment is positioned in proximity to one or more other segments of the same phase type in a manner capable of causing low contrast imaging of a photoresist. In the embodiment of FIG. 7, the low contrast condition may exist if, for example, segment 38a is determined to be within a pre-selected distance of one or more other segments having the same phase type as segment 38a, such as segment 38a'. The pre-selected distance between segments 38a and 38a' that may satisfy the low contrast condition may be chosen to be any suitable distance, and may vary depending on, for example, the wavelength of light used in the imaging process, the illumination conditions used to send light to the mask in the imaging system, the coherency of the light and the numerical aperture of the lenses imaging the mask on the wafer. For example, in some embodiments, the low contrast condition may exist if two segments of the same phase type are within a distance of about $\lambda$ or smaller, such as a distance ranging from about $2\lambda/3$ to about $\lambda/3$.

In other embodiments, a determination of whether the low contrast condition exists may be carried out by calculating the light intensity, or other such parameters indicating a low contrast condition, at one or more positions on or between a first segment and one or more other segments of the same phase type. Other parameters that may indicate a low contrast condition would be readily apparent to one of ordinary skill in the art, and include, for example, the normalized image log slope, or the slope, of the light intensity curve. In regions where the slope of the light intensity curve is relatively small, this may indicate a low contrast condition.

The light intensity can be calculated using modeling software, as is well known in the art. As would be appreciated by one of ordinary skill in the art, the modeled light intensity is not necessarily the same as the light intensity that will be realized during patterning of the photoresist due to modeling limitations. Furthermore, as is well known in the art, while the models can be dominated by light intensity effects, the models may also take into account other effects, such as etch proximity effects, resist chemistry effects and other empirical effects not easily classified. Accordingly, the modeled light intensity may take into account these additional modeling effects.

Where low contrast conditions are determined using a modeled light intensity, the low contrast condition may exist if it is determined that the modeled light intensity between two segments of the same type is above or below a certain threshold value. For example, in one embodiment where a positive photoresist is being employed for patterning interconnect 26 of FIG. 7, the low contrast condition may exist if the light intensity between the segments 38a and 38a' is calculated to be greater than a pre-selected light intensity threshold. In certain other embodiments where a positive photoresist is employed, the low contrast condition may exist if the light intensity between segments is calculated to be lower than a pre-selected light intensity threshold. In another exemplary embodiment, where a negative photoresist is being employed for patterning interconnect 26, the low contrast condition may exist if the light intensity between the two segments 38a and 38a' is lower than a pre-selected light intensity threshold. The value of the pre-selected light intensity threshold may vary depending on the type of photoresist used, the wavelength of light used to image the photoresist, numerical aperture, etch type and pattern density, as well as other factors.

For purposes of the present application, a positive photoresist is a photoresist for which regions of the photoresist exposed to light during the imaging process are removed from the wafer when the photoresist is developed. A negative photoresist is a photoresist for which regions exposed to light during the imaging process remain on the wafer when the photoresist is developed.

In certain embodiments, the light intensity calculation may only be carried out for a particular segment if other preconditions are met. For example, one such precondition may be that the segment be within a pre-selected distance of a second segment of the same type. Another example precondition may be that the segment comprises a portion of a phase pattern for an integrated circuit feature having a non-critical dimension, such as, for example, an interconnect. Because light intensity calculations can be time intensive, performing light intensity calculations only for segments that satisfy such preconditions may save time.

If it is determined that the low contrast condition exists, a second target dimension may be selected that will avoid the low contrast condition, as illustrated in block 52 of the FIG. 5 embodiment. For example, in the embodiment of FIG. 3, $L_i$ may be increased to a length pre-selected to avoid low contrast conditions. The pre-selected length may be any desired length. For example, $L_i$ may be increased to a length which is greater than $\lambda/2$, or in another embodiment, a length that ranges from about $2\lambda/3$ to about $\lambda$, where $\lambda$ is the wavelength of the light used for imaging the photoresist.

In other embodiments, the increase in the length of $L_i$ may be selected when correcting the phase pattern for optical proximity effects. For example, the optical proximity software may be programmed to calculate an increase in $L_i$ required for avoiding the low contrast condition using optical modeling methods. One of ordinary skill in the art would be able to prepare computer readable instructions for determining an appropriate $L_i$ based on known optical modeling methods.

Referring to block 54 of the FIG. 5 embodiment, after selecting a second target dimension, a phase pattern may be generated for an integrated circuit feature having the second target dimension. The phase pattern may be generated in any suitable manner. In some embodiments, the phase pattern incorporating the second target dimension may be formed during the process of generating the phase trim, as part of the initial phase pattern generation process of block 4 of the method of FIG. 1. In other embodiments, where the second target dimension is set while correcting the phase pattern for optical proximity effects, the phase pattern incorporating the new target dimension can be formed during the process of block 6 of FIG. 1, as a corrected version of the phase pattern of the block 4 process. In these embodiments, as well as in the other embodiments described herein, the phase pattern incorporating the second target dimension may be adjusted during the optical proximity correction process to take into account optical proximity effects.

As illustrated in FIG. 1 and described above, the process of detecting and avoiding low contrast conditions may be carried out in the phase pattern generation process of block 4, or alternatively, in the optical proximity correction process of block 6. In yet other embodiments, the detection of the low contrast condition may be carried out in a separate process from the process of avoiding the low contrast condition.

For example, in an embodiment, the determination process of block 50 in the FIG. 5 embodiment may be carried out in the phase pattern generation process of block 4 of FIG. 1; and then selecting a second target and forming the phase pattern, as set forth in blocks 52 and 54, may be carried out during the optical proximity correction process described in block 6 of FIG. 1. This may be accomplished by, for example, generating one or more markers that identify the low contrast imaging condition in a first phase pattern generated during the process of block 4. In one such embodiment, markers 39 are positioned in the phase pattern proximate the low contrast region, as illustrated in the embodiment of FIG. 3. The software employed during the optical proximity correction process of block 6 may comprise instructions for recognizing the one or more markers and selecting a second target dimension to correct the low contrast imaging condition identified by the markers when forming the second corrected phase pattern during the optical proximity correction process of block 6. Selecting the second target dimension may be accomplished by any of the methods described above, such as increasing the target dimension by a pre-selected amount, or by calculating the target dimension using the optical proximity modeling software.

In yet other embodiments, the determination process of block 50 and the process of selecting a second target as set forth in block 52, may be carried out during the process of generating the phase pattern in block 4 of FIG. 1; and then the process of forming the phase pattern, as set forth in block 54 of FIG. 5, may be carried out during the optical proximity correction process in block 6 of FIG. 1. This may be accomplished by, for example, generating one or more markers that identify the low contrast imaging condition in a first phase pattern generated during the process of block 4, similarly as described above. However, in these embodiments, the markers may be associated with one or more target dimensions selected during the process of block 4 for avoiding the low contrast condition. For example, the width, length and/or relative position of the markers may be varied according to the size of the desired target dimensions for avoiding the low contrast condition. In one embodiment, as illustrated in FIG. 3, the relative distance between markers 39 may adjusted to adjust length, $L_i$. In another embodiment, the length and/or width of the markers may be adjusted to vary the length of an integrated circuit feature. For example, the length and/or width of one or more markers (not shown) positioned proximate to contact 60 in FIG. 6 could be varied to adjust the width and/or length of contact 60. The software employed during the optical proximity correction process of block 6 may comprise instructions for recognizing the markers and reading the one or more associated target dimensions based on, for example, the width or length of the markers, and then using these target dimensions as a basis for forming the second corrected phase pattern during the optical proximity correction process.

Other embodiments of the present application are directed to photomasks made by any of the methods described herein. One such embodiment is directed to a phase shift mask comprising a phase pattern for an integrated circuit feature having a second target dimension, wherein the phase pattern of the integrated circuit feature is described in a design database as having a first target dimension. The phase shift mask is formed by a method comprising determining whether forming a phase pattern for the integrated circuit feature described in the design database will result in one or more phase blocks of the same phase type being positioned in relative proximity to each other so as to result in a low contrast condition. If the low contrast condition will result, a second target dimension is selected that will avoid the low contrast condition. The phase shift masks according to the present application comprise a phase mask pattern for the integrated circuit feature having the second target dimension.

In one such embodiment, the method results in a phase shift mask similar to that shown in FIG. 3 or 6, wherein one or more phase blocks 38 of the same phase type are positioned to form a non-critical target dimension, such as interconnect 26 or contact 60. The phase blocks 38 are also positioned relative to phase blocks of a different phase type, such as phase blocks 36 in FIGS. 3 and 6, so as to form an integrated circuit feature having a critical dimension. In the phase shift masks of the present application, phase blocks 38 are spaced relative to each other so that the non-critical target dimension is larger that the critical target dimension. For example, in FIG. 3, the phase shift blocks are positioned so that $L_i$ is substantially greater than the gate length $L_g$ (shown in FIG. 2), so as to avoid the low contrast condition. For example, $L_i$ may be greater or equal to $L_g+\lambda/5$, where $\lambda$ is the wavelength of light to be used for imaging the photoresist. In yet another example, $L_i$ may be greater or equal to $L_g+\lambda/3$. Similarly, in the embodiment of FIG. 6, the width of contact 60 can be adjusted by adjusting the distance between regions 38a and 38b of phase block 38, to be greater than the gate length of the gate 22 to which contact 60 is attached. For example, the width of contact 60 may be greater than the gate length of the gate 22 to which it is attached by at least $\lambda/5$, or in another example, by at least $\lambda/3$.

Other embodiments of the present application are directed to methods of forming an integrated circuit employing the photomasks made by the processes of the present application. In embodiments, integrated circuits can be formed by applying a photoresist to a wafer and then exposing the photoresist to radiation through a photomask made by any of the methods described above. The exposed photoresist is then developed by methods well known in the art. An etching process can then be carried out using the photoresist to pattern the wafer, as is also well known in the art.

Yet other embodiments of the present application are directed to integrated circuits formed using the photomasks of the present application. In embodiments, integrated circuits can be patterned by applying a photoresist to a wafer and then exposing the photoresist to radiation through a photomask made by any of the methods described above. The exposed photoresist is then developed by methods well known in the art. An etching process can then be carried out using the photoresist to pattern the wafer, as is also well known in the art.

Integrated circuits patterned using the phase shift masks of the present application can comprise features having non-critical target dimension which are adjusted to be larger than the target dimensions for the feature in the original design of the integrated circuit. In embodiments, as described above with respect to FIGS. 2 and 3, dimension $L_i$ of interconnect 26 may be adjusted to be substantially larger than originally designed so as to avoid the low contrast condition. For example, in one embodiment where $L_i$ is designed to be about the same length as gate length $L_g$, $L_i$ may be adjusted to be greater or equal to $L_g+\lambda/5$, where $\lambda$ is the wavelength of light to be used for imaging the photoresist. In yet another example, $L_i$ may be greater or equal to $L_g+/3$. Similarly, in the embodiment of FIG. 6, the width of contact 60 can be adjusted by adjusting the distance between regions 38a and 38b of phase block 38, to be greater than the gate length of the gate 22 to which contact 60 is attached. For example, the width of contact 60 may be greater than the gate length of the gate 22 to which it is attached by at least λ/5, or in another example, by at least λ/3.

Figure 8:
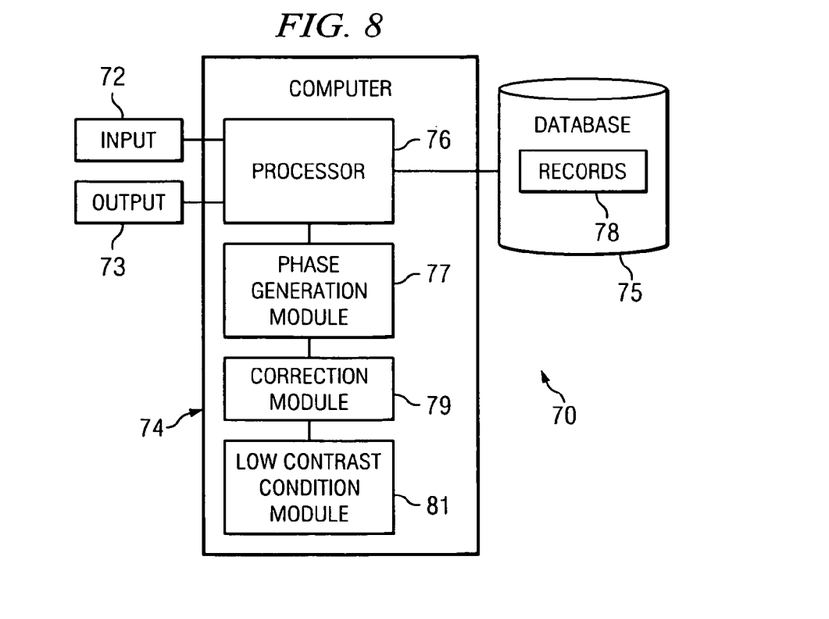
FIG. 8 illustrates a system 70 for forming a phase pattern, according to an embodiment of the present application.

FIG. 8 illustrates a system 70 for forming a phase pattern. System 70 includes an input device 72 and an output device 73 coupled to a computer 74, which is in turn coupled to a database 75. Input device 72 may comprise, for example, a keyboard, a mouse, or any other device suitable for transmitting data to computer 74. Output device 73 may comprise, for example, a display, a printer, or any other device suitable for outputting data received from computer 74.

Computer 74 may comprise a personal computer, workstation, network computer, wireless computer, or one or more microprocessors within these or other devices, or any other suitable processing device. Computer 74 may include a processor 76, a phase pattern generation module 77 and/or a correction module 79, as well as a low contrast condition module 81.

The above modules, including phase pattern generation module 77, correction module 79, and low contrast condition module 81, can exist as software that comprises program instructions in source code, object code, executable code or other formats; program instructions implemented in firmware; or hardware description language (HDL) files. Any of the above can be embodied on a computer readable medium, which include storage devices and signals, in compressed or uncompressed form. Exemplary computer readable storage devices include conventional computer system RAM (random access memory), ROM (read-only memory), EPROM (erasable, programmable ROM), EEPROM (electrically erasable, programmable ROM), and magnetic or optical disks or tapes.

Processor 76 controls the flow of data between input device 72, output device 73, database 75, phase pattern generation module 77 and/or a correction module 79, as well as a low contrast condition module 81. Phase pattern generation module 77 may receive descriptions of integrated circuit device features from design database 2 and generate phase patterns as described above. Correction module 79 may receive descriptions of phase patterns generated from phase pattern generation module 77 and generate corrected phase patterns therefrom, as described above. In an embodiment, a low contrast condition module 81 may be accessed by either or both of modules 77 and 79 to detect and avoid low contrast conditions, as described above. In various embodiments, the processes for detecting and avoiding low contrast conditions may be accomplished by separate modules, which may be stored on separate databases and/or employed by separate processors. For example, a module for determining whether a low contrast condition exists may be accessed by a phase pattern generation module 74 on a first processor; and then a module for selecting a second target dimension may be accessed by the correction module 79 on a second processor.

Database 75 may comprise any suitable system for storing data. Database 75 may store records 78 that comprise data associated with the integrated circuit device features. Records 78 may also comprise data associated with recognizing and/or defining low contrast conditions, as well as parameters used for avoiding low contrast conditions.

For the purposes of this specification and appended claims, unless otherwise indicated, all numbers expressing quantities, percentages or proportions, and other numerical values used in the specification and claims, are to be understood as being modified in all instances by the term "about." Accordingly, unless indicated to the contrary, the numerical parameters set forth in the following specification and attached claims are approximations that can vary depending upon the desired properties sought to be obtained by the present disclosure. At the very least, and not as an attempt to limit the application of the doctrine of equivalents to the scope of the claims, each numerical parameter should at least be construed in light of the number of reported significant digits and by applying ordinary rounding techniques.

It is noted that, as used in this specification and the appended claims, the singular forms "a," "an," and "the," include plural referents unless expressly and unequivocally limited to one referent. Thus, for example, reference to "an acid" includes two or more different acids. As used herein, the term "include" and its grammatical variants are intended to be non-limiting, such that recitation of items in a list is not to the exclusion of other like items that can be substituted or added to the listed items.

While particular embodiments have been described, alternatives, modifications, variations, improvements, and substantial equivalents that are or can be presently unforeseen can arise to applicants or others skilled in the art. Accordingly, the appended claims as filed and as they can be amended are intended to embrace all such alternatives, modifications variations, improvements, and substantial equivalents.

What is claimed is:

1. A method of fabricating an integrated circuit using a photomask comprising a phase pattern for forming an integrated circuit feature described in a design database as having a first target dimension, the method comprising:
   providing the photomask, including:
      determining whether forming the integrated circuit using the photomask with a phase pattern for the integrated circuit feature having the first target dimension as described in the design database will result in one or more phase blocks of the same phase type being positioned in relative proximity to each other so as to result in a low contrast condition;
      automatically changing the first target dimension to a second target dimension that will avoid the low contrast condition if the determining step determines that a low contrast condition will result; and
      forming the phase pattern for the integrated circuit feature having the second target dimension; and
   forming the integrated circuit with the integrated circuit feature having the second target dimension instead of the first target dimension using the photomask.

2. The method of claim 1, wherein selecting the second target dimension comprises choosing a second target dimension which is larger than the first target dimension by a preselected amount.

3. The method of claim 1, wherein forming the phase pattern further comprises:
   generating a first phase pattern for the integrated circuit feature; and
   correcting the first phase pattern to account for optical proximity effects to thereby form a corrected second phase pattern.

4. The method of claim 3, wherein changing the first target dimension to the second target dimension comprises choosing a second target dimension which is larger than the first target dimension by a pre-selected amount when forming the first phase pattern.

5. The method of claim 3, wherein providing the photomask further comprises generating one or more markers that identify the low contrast imaging condition in the first phase pattern.

6. The method of claim 5, wherein the process of changing the first target dimension to the second target dimension is carried out prior to generating the one or more markers, and further wherein the one or more markers are associated with the selected second target dimension.

7. The method of claim 5, wherein the process of changing the first target dimension to the second target dimension is carried out when forming the second phase pattern.

8. The method of claim 1, wherein the process of determining whether the low contrast condition will result comprises:
dividing the one or more phase blocks of the same phase type into a plurality of segments; and
determining whether the first target dimension of the integrated circuit feature is a non-critical dimension; and, if so, determining whether a low contrast condition exists in which a segment is positioned in proximity to one or more other segments of the same phase type in a manner capable of causing low contrast imaging of a photoresist.

9. The method of claim 8, wherein the low contrast condition exists for a first segment if the first segment is within a pre-selected distance of one or more other segments of the same phase type.

10. The method of claim 8, wherein the low contrast condition exists for a first segment if a modeled light intensity between the first segment and one or more other segments of the same type is less than a pre-selected light intensity threshold.

11. The method of claim 8, wherein the low contrast condition exists for a first segment if a modeled light intensity between the first segment and one or more other segments of the same type is greater than a pre-selected light intensity threshold.

12. The method of claim 8, wherein, if the low contrast condition exists, changing the first target dimension to the second target dimension comprises increasing the target dimension of at least a portion of the integrated circuit feature associated with each segment for which the low contrast imaging condition exists.

13. The method of claim 1, wherein the determining process comprises determining whether forming a phase pattern for the integrated circuit feature described in the design database will result in a single phase block of the same phase type being positioned so that portions of the phase block are in relative proximity to each other so as to result in a low contrast condition.

14. The method of claim 1, wherein the determining process comprises determining whether forming the phase pattern for the integrated circuit feature described in the design database will result in two phase blocks of the same phase type being positioned in relative proximity to each other so as to result in a low contrast condition.

15. The method of claim 14, wherein the two phase blocks are both zero phase blocks.

16. The method of claim 14, wherein the two phase type are both $\pi$ phase blocks.

17. The method of claim 1, wherein the integrated circuit feature is an interconnect.

18. A method of claim 1, wherein the integrated circuit is formed using light transmitted through the photomask; the first target dimension is less than about a wavelength of the light; and the second target dimension is greater than the first target dimension.

19. A system for generating a phase pattern for a photomask, the system comprising:
a database operable to store data describing established design parameters of an integrated circuit to be fabricated with at least one integrated circuit feature having a first target dimension; and
a module coupled to the database, wherein the module comprises a set of instructions operable to:
determine whether forming the integrated circuit using a photomask with a phase pattern for the integrated circuit feature having the first target dimension as described in the database will result in one or more phase blocks of the same phase type being positioned in relative proximity to each other so as to result in a low contrast condition; and
generate some output to automatically alter the phase pattern to change the first target dimension in the established design parameters to a second target dimension for fabricating the integrated circuit that will avoid the low contrast condition if the low contrast condition will result.

20. The system of claim 19, wherein the module is operable to alter the phase pattern by increasing the size of the target dimension for the formed integrated circuit by a pre-selected amount so that the distance between the one or more phase blocks in the phase pattern is sufficient to avoid the low contrast condition.

21. The system of claim 20, wherein the module is operable to alter the phase pattern by generating one or more markers that identify the low contrast imaging condition in the phase pattern.

22. The system of claim 19, wherein the module is operable to determine whether the data describes a low contrast condition by:
dividing the one or more phase blocks into a plurality of segments; and
determining whether the first target dimension of the integrated circuit feature is a non-critical dimension, and if so, determining whether a low contrast condition exists in which a segment is positioned in proximity to one or more other segments of the same phase type in a manner capable of causing low contrast imaging of a portion of a photoresist mask used for patterning the integrated circuit feature.

23. The system of claim 22, wherein the module is operable to determine if the low contrast condition exists for a first segment by determining if the first segment is within a pre-selected distance of the one or more other segments of the same phase type.

24. The system of claim 22, wherein the module is operable to determine if the low contrast condition exists by determining if a modeled light intensity between the first segment and the one or more other segments of the same type is greater than a pre-selected light intensity threshold.

25. The system of claim 22, wherein the module is operable to determine if the low contrast condition exists by determining if a modeled light intensity between the first segment and the one or more other segments of the same type is less than a pre-selected light intensity threshold.

26. The system of claim 22, wherein if the low contrast condition exists, the module is capable of altering the phase pattern by increasing the target dimension of at least the portion of the integrated circuit feature associated with each segment for which the low contrast imaging condition exists.

27. The system of claim 19, wherein the module instructions describe the integrated circuit feature as an interconnect.

* * * * *